US 11,839,110 B2

(12) United States Patent
Lee et al.

(10) Patent No.: US 11,839,110 B2
(45) Date of Patent: Dec. 5, 2023

(54) ORGANIC LIGHT-EMITTING DISPLAY DEVICE

(71) Applicant: LG Display Co., Ltd., Seoul (KR)

(72) Inventors: Seok-Hyun Lee, Seoul (KR); Woo-Sup Shin, Paju-si (KR); Sang-Moo Park, Goyang-si (KR); Chang-Wook Song, Seoul (KR); Hae-Lim Jung, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 259 days.

(21) Appl. No.: 16/567,373

(22) Filed: Sep. 11, 2019

(65) Prior Publication Data

US 2020/0091264 A1     Mar. 19, 2020

(30) Foreign Application Priority Data

Sep. 18, 2018  (KR) .................. 10-2018-0111823

(51) Int. Cl.
| | |
|---|---|
| *H10K 59/121* | (2023.01) |
| *H10K 50/844* | (2023.01) |
| *H10K 59/124* | (2023.01) |
| *H10K 59/126* | (2023.01) |
| *H10K 59/131* | (2023.01) |

(52) U.S. Cl.
CPC ....... *H10K 59/1213* (2023.02); *H10K 50/844* (2023.02); *H10K 59/124* (2023.02); *H10K 59/126* (2023.02); *H10K 59/131* (2023.02)

(58) Field of Classification Search
CPC ............. H01L 27/3262; H01L 27/3272; H01L 27/3276
See application file for complete search history.

(56) References Cited

U.S. PATENT DOCUMENTS

| | | | |
|---|---|---|---|
| 10,074,676 B2 | 9/2018 | Jeon et al. | |
| 10,608,060 B2 | 3/2020 | Kim et al. | |
| 2005/0127810 A1 | 6/2005 | Fukuhara et al. | |
| 2008/0018821 A1* | 1/2008 | Park ................... | G02F 1/13439 |
| | | | 349/47 |

(Continued)

FOREIGN PATENT DOCUMENTS

| | | |
|---|---|---|
| CN | 1617032 A | 5/2005 |
| CN | 103730346 A | 4/2014 |

(Continued)

OTHER PUBLICATIONS

Office Action dated Jan. 18, 2023, issued in corresponding Chinese Patent Application No. 201910836820.7 (with partial translation).

(Continued)

*Primary Examiner* — Matthew C Landau
*Assistant Examiner* — Mark Hatzilambrou
(74) *Attorney, Agent, or Firm* — Morgan, Lewis & Bockius LLP

(57) ABSTRACT

An organic light-emitting display device comprises a substrate, a driving thin-film transistor including an active layer on the substrate, source and drain electrodes directly contacting the active layer, and a gate electrode on the active layer, and an organic light-emitting element connected to the driving thin-film transistor. Each of the source and drain electrodes of the driving thin-film transistor exposes a respective side surface of the active layer.

17 Claims, 15 Drawing Sheets

(56) References Cited

U.S. PATENT DOCUMENTS

| | | | |
|---|---|---|---|
| 2013/0063673 A1 | 3/2013 | Choi et al. | |
| 2016/0013317 A1* | 1/2016 | Zhao et al. | |
| 2017/0345882 A1* | 11/2017 | Nam | H01L 27/3246 |
| 2018/0033847 A1 | 2/2018 | Kim et al. | |
| 2018/0122882 A1 | 5/2018 | Lee et al. | |
| 2018/0122883 A1* | 5/2018 | Beak | H01L 27/3248 |
| 2018/0122888 A1 | 5/2018 | Jung et al. | |
| 2018/0158845 A1* | 6/2018 | Liao | G02F 1/13624 |
| 2019/0006524 A1 | 1/2019 | Guo et al. | |

FOREIGN PATENT DOCUMENTS

| | | |
|---|---|---|
| CN | 106597770 A | 4/2017 |
| CN | 107665906 A | 2/2018 |
| CN | 108122945 A | 6/2018 |
| KR | 10-2006-0045258 A | 5/2006 |
| KR | 10-2010-0060502 A | 6/2010 |
| KR | 10-2014-0113157 A | 9/2014 |
| KR | 10-2016-0055369 A | 5/2016 |
| KR | 10-2017-0077371 A | 7/2017 |
| KR | 10-2017-0135182 A | 12/2017 |
| KR | 10-2017-0143082 A | 12/2017 |

OTHER PUBLICATIONS

Office Action dated Jun. 1, 2023, issued in corresponding Chinese Patent Application No. 201910836820.7.
Notice of Allowance dated Aug. 30, 2023, issued in corresponding Chinese Patent Application No. 201910836820.7.
Korean Office Action dated Sep. 30, 2023, issued in corresponding Korean Patent Application No. 10-2018-0111823.

* cited by examiner

ORGANIC LIGHT-EMITTING DISPLAY DEVICE

CROSS-REFERENCE TO RELATED APPLICATIONS

This application claims the benefit of Korean Patent Application No. 10-2018-0111823, filed in Korea on Sep. 18, 2018, which is hereby incorporated by reference as if fully set forth herein.

BACKGROUND

Technical Field

The present disclosure relates to an organic light-emitting display device, and more particularly, to an organic light-emitting display device for simplifying the structure and manufacturing process thereof.

Discussion of the Related Art

An image display device, which displays various pieces of information on a screen, is a core technology of the information and communication age, and is being developed to be thinner, lighter, more portable, and higher performing. Hence, organic light-emitting display devices, which are capable of overcoming the problems of disadvantageous weight and volume associated with a cathode ray tube (CRT), are attracting attention. Organic light-emitting display (OLED) devices may be self-illuminating devices and have low power consumption, a high response speed, high luminance efficiency, high brightness, and a wide viewing angle. Such OLED devices display an image using a plurality of subpixels, which are arranged in a matrix form. Each of the subpixels includes a light-emitting element and a pixel-driving circuit having multiple transistors that implement independent driving of the light-emitting element.

Typically, in order to manufacture an OLED device, a mask process using a photomask is performed a plurality of times. Each mask process may involve subprocesses, such as washing, exposure, developing, and etching processes. To this end, whenever an additional mask process is added, the time and costs for the manufacture of the OLED device increase, and the rate of generation of defective products increases, which results in a lower production yield. Therefore, there is a demand for a simplified structure and manufacturing process in order to reduce production costs and to enhance production yield and production efficiency.

SUMMARY OF THE DISCLOSURE

Accordingly, the present disclosure is directed to an organic light-emitting display device that substantially obviates one or more problems due to the limitations and disadvantages of the related art.

An object of the present disclosure is to provide an organic light-emitting display device for simplifying the structure and manufacturing process thereof.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, an organic light-emitting display device comprises a substrate; a driving thin-film transistor including an active layer on the substrate, source and drain electrodes directly contacting the active layer, and a gate electrode on the active layer; and an organic light-emitting element connected to the driving thin-film transistor, wherein each of the source and drain electrodes of the driving thin-film transistor exposes a respective side surface of the active layer.

Accordingly, because each of the source and drain electrodes and the active layer are directly connected to each other without a separate contact hole, it is possible to reduce the total number of contact holes and thus improve an aperture ratio. In addition, because the number of mask processes is reduced, it is possible to simplify the structure and manufacturing process of the device and consequently achieve enhanced productivity.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION

Reference will now be made in detail to some embodiments of the present disclosure, examples of which are illustrated in the accompanying drawings. Wherever possible, the same reference numbers will be used throughout the drawings to refer to the same or like parts.

Figure 1:
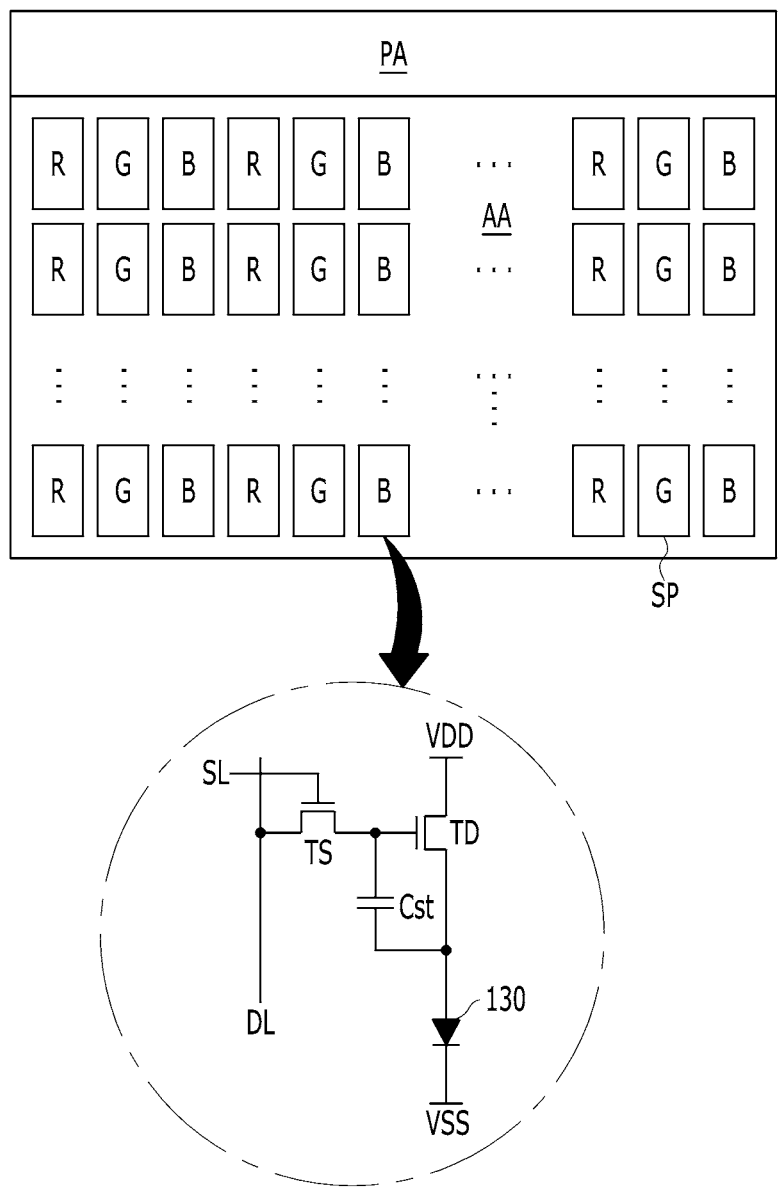
FIG. 1 is a plan view illustrating an organic light-emitting display device according to a first embodiment of the present disclosure.

FIG. 1 is a plan view illustrating an organic light-emitting display device according to a first embodiment of the present disclosure.

Figure 2:
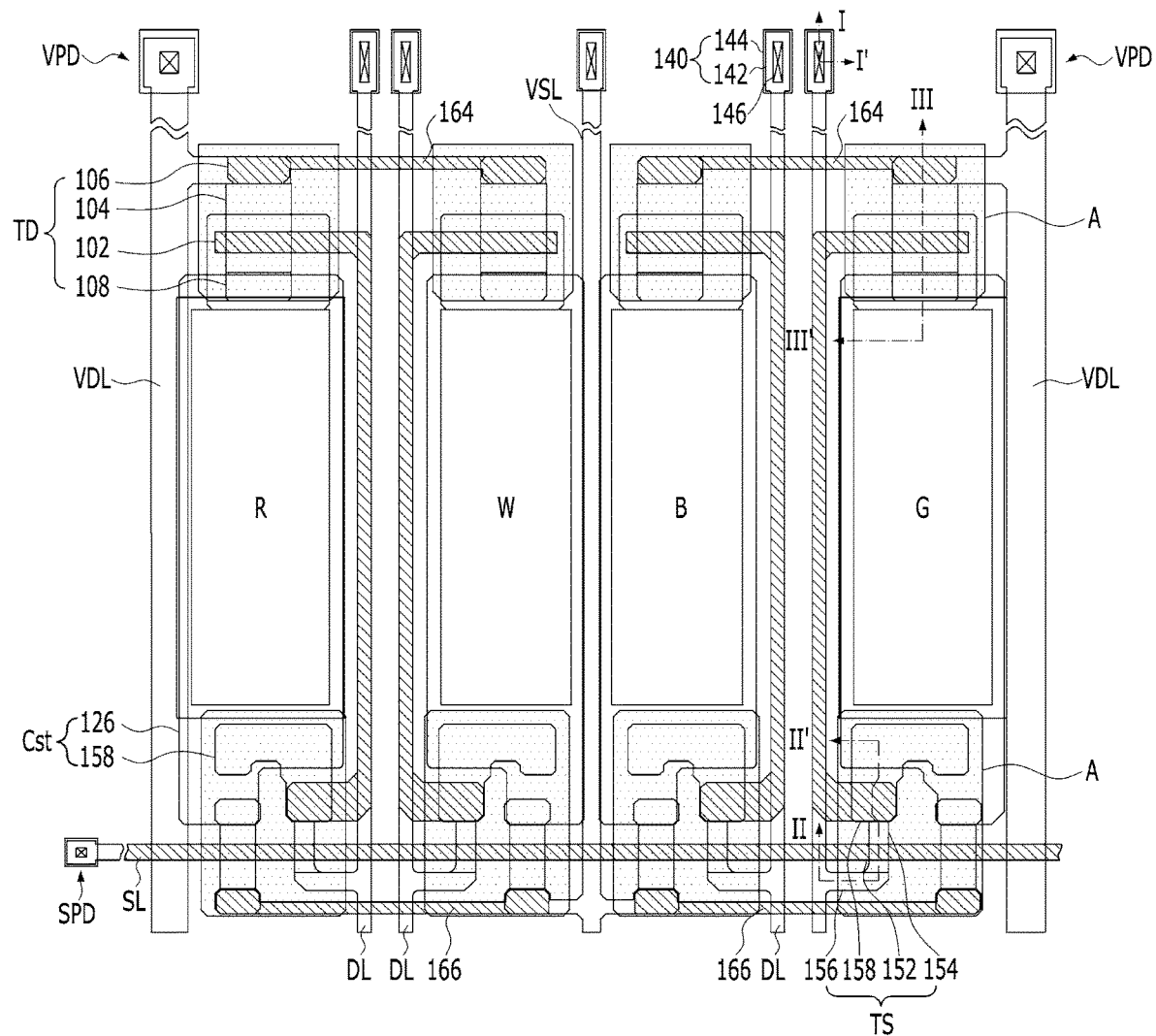
FIG. 2 is a plan view illustrating the unit pixel illustrated in FIG. 1.
Figure 3:
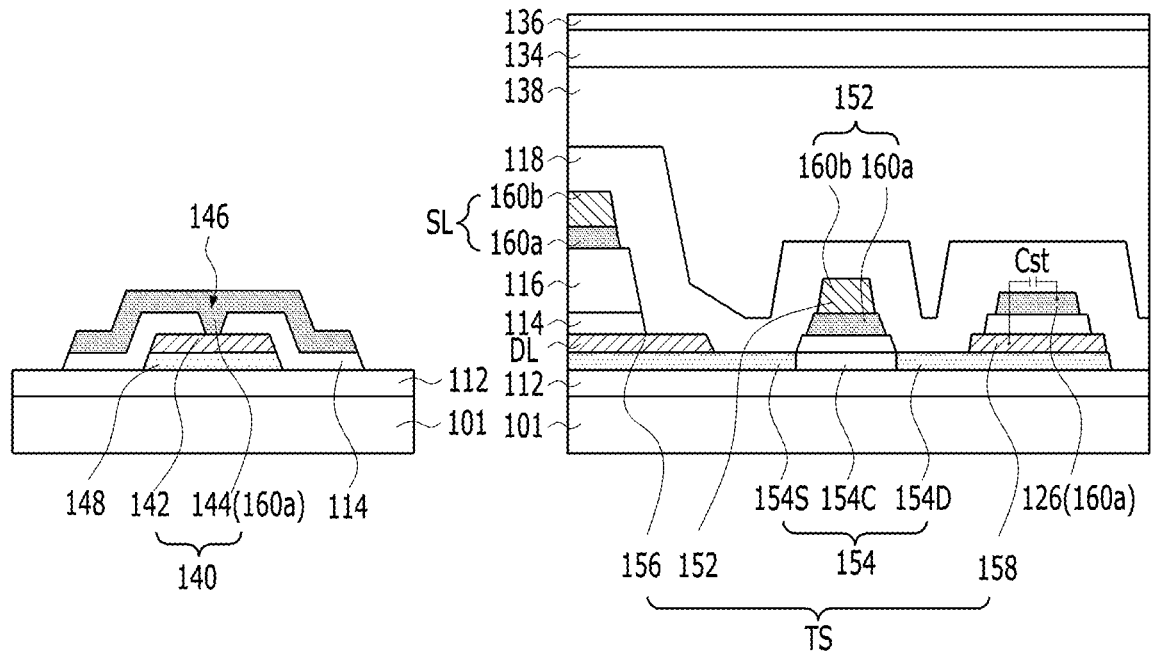
FIG. 3 illustrates cross-sectional views taken along lines I-I', II-II' and III-III' in the organic light-emitting display device illustrated in FIG. 2.
Figure 3:
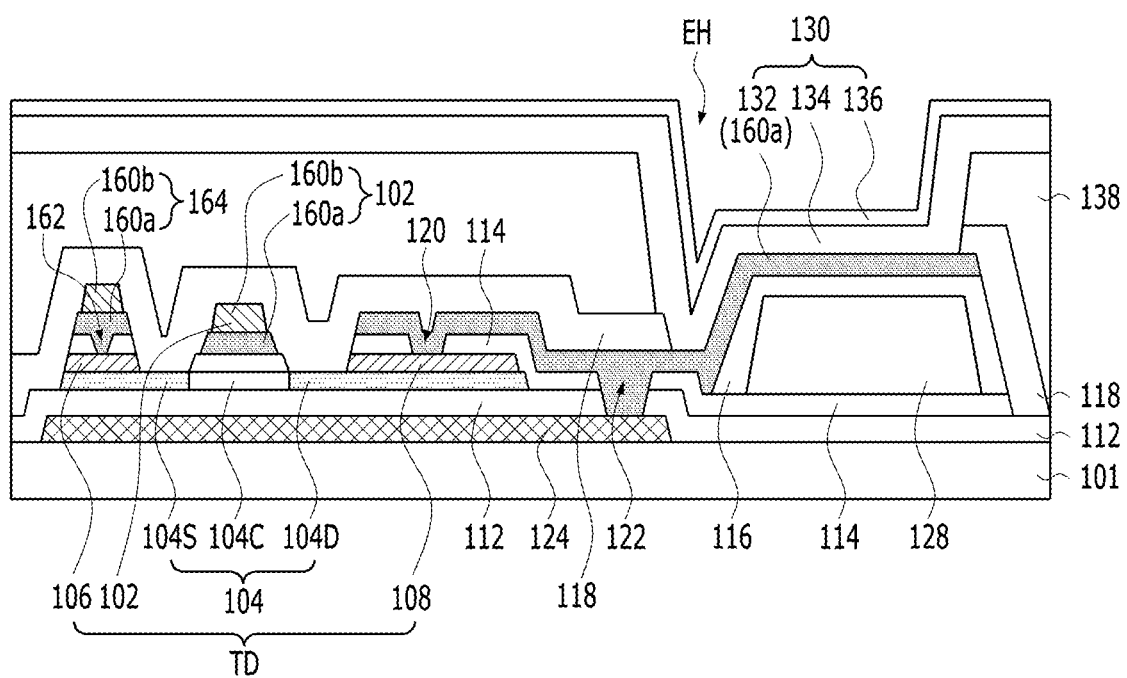

The organic light-emitting display device illustrated in FIG. 1 includes an active area AA and a pad area PA. In the pad area PA, as illustrated in FIGS. 2 and 3, there is provided a scan pad SPD, which supplies a driving signal to a scan line SL disposed in the active area AA, a data pad 140, which supplies a driving signal to a data line DL, and a power source pad VPD, which supplies a driving signal to each of a high-potential voltage VDD supply line VDL and a low-potential voltage VSS supply line VSL.

At least one conductive pad among the scan pad SPD, the data pad 140, or the power source pad VPD includes a lower pad electrode 142 and an upper pad electrode 144.

The lower pad electrode 142 is formed of the same material as source and drain electrodes 106, 108, 156 and 158 on an active layer 148. The lower pad electrode 142 has the same line width and shape as the active layer.

The upper pad electrode 144 is electrically connected to a portion of the lower pad electrode 142 that is exposed through a pad contact hole 146 penetrating a gate insulation film 114. The upper pad electrode 144 is formed as a transparent conductive layer 160a, which is the same as that of an anode 132. The upper pad electrode 144 has the same line width and shape as the gate insulation film 114, which is disposed under the upper pad electrode 144.

The active area AA displays an image through unit pixels, each of which includes a light-emitting element 130. For example, each unit pixel includes red (R), green (G), and blue (B) subpixels SP, or includes red (R), green (G), blue (B), and white (W) subpixels SP.

Data lines DL are disposed between the red (R) and white (W) subpixels SP and between the green (G) and blue (B) subpixels. A high-potential voltage line VDL for supplying a high-potential voltage VDD is disposed between the green (G) and red (R) subpixels SP, and the high-potential voltage VDD is supplied to the green (G) and red (R) subpixels SP via the high-potential voltage line VDL. The high-potential voltage VDD is supplied to the white (W) and blue (B) subpixels SP via a first connection part 164, which is connected to the high-potential voltage line VDL. A low-potential voltage line VSL for supplying a low-potential voltage VSS is disposed between the white (W) and blue (B) subpixels SP, and the low-potential voltage VSS is supplied to the white (W) and blue (B) subpixels SP via the low-potential voltage line VSL. The low-potential voltage VSS is supplied to the green (G) and red (R) subpixels SP via a second connection part 166, which is connected to the low-potential voltage line VSL. Alternatively, instead of the low-potential voltage line VSL, a reference voltage line for supplying a reference voltage Vref, which is used in a sensing mode, may be disposed.

A gate insulation film 114 and a planarization layer 116 are disposed on the intersection between a vertical line, which includes at least one of the data line DL, the low-potential voltage line VSL, or the high-potential voltage line VDL, which extends in the vertical direction, and a horizontal line, which includes at least one of the scan line SL, the first connection part 164, or the second connection part 166, which extends in the horizontal direction. Thus, it may be possible to prevent the occurrence of a short circuit at the intersection between the vertical line and the horizontal line.

Each subpixel includes a light-emitting element 130 and a pixel-driving circuit that implements independent driving of the light-emitting element 130. The pixel-driving circuit includes a switching thin-film transistor TS, a driving thin-film transistor TD, and a storage capacitor Cst.

When a scan pulse is supplied to the scan line SL, the switching thin-film transistor TS is turned on, and supplies the data signal supplied to the data line DL to the storage capacitor Cst and to a gate electrode of the driving thin-film transistor TD.

The driving thin-film transistor TD controls the current I to be supplied from the high-potential voltage VDD supply line VDL to the light-emitting element 130 in response to the data signal supplied to the gate electrode of the driving thin-film transistor TD, thereby adjusting the amount of light emitted from the light-emitting element 130. Then, even if the switching thin-film transistor TS is turned off, the driving thin-film transistor TD maintains the emission of light by the light-emitting element 130 by supplying a constant amount of current I thereto using the voltage charged in the storage capacitor Cst until a data signal of a next frame is supplied.

Each of the switching thin-film transistor TS and the driving thin-film transistor TD, as illustrated in FIGS. 2 and 3, includes a gate electrode 152 and 102, a source electrode 156 and 106, a drain electrode 158 and 108, and an active layer 154 and 104.

The gate electrode 152 and 102 is formed on the gate insulation film 114, which has the same shape as the gate electrode 152 and 102. The gate electrode 152 and 102 overlaps a channel region of the active layer 154 and 104, with the gate insulation film 114 interposed therebetween. Each of the gate electrode 152 and 102, the scan line SL, and the first and second connection parts 164 and 166 includes a transparent conductive layer 160a and an opaque conductive layer 160b disposed on the transparent conductive layer 160a. The transparent conductive layer 160a is formed of a transparent material, such as indium-tin-oxide (ITO) or indium-zinc-oxide (IZO), which is the same material as the anode 132. The opaque conductive layer 160b has the same shape as the transparent conductive layer 160a. The opaque conductive layer 160b may have a single-layer or multi-layer structure, and may be formed of a material selected from the group consisting of aluminum (Al), chrome (Cr), gold (Au), nickel (Ni), neodymium (Nd), copper (Cu), and alloys thereof, without being limited thereto.

The source electrode 156 and 106 is disposed on the active layer 154 and 104 so as to expose the side surface of the active layer 154 and 104, and is in direct contact with the active layer 154 and 104 without a separate contact hole. The entire lower surface of the source electrode 106 and 156 is in direct contact with a source region 154S and 104S of the active layer 154 and 104. The source electrode 106 of the driving thin-film transistor TD is directly connected to the high-potential supply line VDL, or is connected to the first connection part 164 through the source contact hole 162 penetrating the gate insulation film 114.

Similarly, the drain electrode 108 and 158 is disposed on the active layer 154 and 104 so as to expose the side surface of the active layer 154 and 104, and is in direct contact with the active layer 154 and 104 without a separate contact hole. The entire lower surface of the drain electrode 108 and 158 is in direct contact with a drain region 154D and 104D of the active layer 154 and 104.

The drain electrode 108 of the driving thin-film transistor TD is exposed through a pixel contact hole 120 penetrating the gate insulation film 114, and is connected to the anode 132.

Each of the source electrode 156 and 106 and the drain electrode 158 and 108 is formed of a conductive layer having corrosion resistance to etching gas of the gate insulation film 114. For example, each of the source electrode 156 and 106 and the drain electrode 158 and 108 may have a single-layer or multi-layer structure, and may be formed of a material selected from the group consisting of aluminum (Al), copper (Cu), and an alloy thereof, without being limited thereto. Thus, when the pixel contact hole 120 is formed in order to expose the drain electrode 158 and 108, even if the gate insulation film 114 is over-etched, it may be possible to prevent the drain electrode 158 and 108 from being lost.

The active layer 154 and 104 includes a channel region 154C and 104C, and further includes a source region 154S and 104S and a drain region 154D and 104D, which face each other with the channel region 154C and 104C interposed therebetween. The channel region 154C and 104C overlaps the gate electrode 152 and 102, with the gate insulation film 114 interposed therebetween, and forms a channel between the source and drain electrodes 156, 106, 158, and 108. The source region 154S and 104S is a region that is made conductive and that is directly connected to the source electrode 156 and 106. Similarly, the drain region 154D and 104D is a region that is made conductive and that is directly connected to the drain electrode 158 and 108.

The active layer 154 and 104 is formed on a buffer film 112 and is formed of at least one of an oxide semiconductor material, a polycrystalline semiconductor material, or an amorphous semiconductor material, which includes at least one material selected from the group consisting of Zn, Cd, Ga, In, Sn, Hf, and Zr. The buffer film 112 is formed on a substrate 101, which is formed of glass or plastic resin such as polyimide (PI), and is formed in a single-layer or multi-layer structure using silicon oxide or silicon nitride. The buffer layer 112 serves to prevent the diffusion of moisture or impurities generated in the substrate 101 and/or to control a heat transfer rate during crystallization so that the active layer 154 and 104 may be crystallized well.

In order to prevent external light from being incident on the channel region 154C and 104C of at least one of the switching thin-film transistor TS and the driving thin-film transistor TD, a light-shielding layer 124 is formed on the substrate 101 and the buffer layer 112. For example, the light-shielding layer 124 may selectively overlap the driving thin-film transistor TD, which controls the current that is supplied to the light-emitting element 130, rather than the switching thin-film transistor TS, which performs a switching function.

The light-shielding layer 124 is exposed by a light-shielding hole 122 penetrating the gate insulation film 114 and the buffer layer 112, and is electrically connected to the anode 132. Accordingly, the light-shielding layer 124 has the same potential as the anode 132 without floating, and thus does not have an influence on the driving of the driving thin-film transistor TD, which is disposed so as to overlap the light-shielding layer 124.

The storage capacitor Cst is formed as a result of overlapping the drain electrode 158 of the switching thin-film transistor TS and a storage electrode 126 with the gate insulation film 114 interposed therebetween. The storage electrode 126 is formed of a transparent conductive layer 160a, which is the same as that of the anode 132. The storage electrode 126 is disposed on the gate insulation film 114 and is connected to the drain electrode 108 of the driving thin-film transistor TD. A protective film 118 and a bank 138 are sequentially disposed on the storage electrode 126.

Even when the switching thin-film transistor TS is turned off, the driving thin-film transistor TD maintains the emission of light by the light-emitting element 130 by supplying a constant amount of current thereto using the voltage charged in the storage capacitor Cst until a data signal of a next frame is supplied.

The light-emitting element 130 includes an anode 132, which is connected to the drain electrode 108 of the driving thin-film transistor TD, at least one light-emitting stack 134, which is formed on the anode 132, and a cathode 136, which is formed on the light-emitting stack 134 so as to be connected to the low-potential voltage VSS supply line VSL. Here, the low-potential voltage VSS supply line VSL supplies low-potential voltage VSS that is lower than the high-potential voltage VDD.

Because the anode 132 is formed through the same mask process as the gate electrode 152 and 102 and the scan line SL, the anode 132 is formed of a transparent conductive layer 160a, such as indium-tin-oxide (ITO) or indium-zinc-oxide (IZO), which is included in the gate electrode 152 and 102. The upper surface of the anode 132 is exposed by an emission hole EH penetrating the bank 138 which defines an emission region.

The light-emitting stack 134 is formed by stacking a hole transport layer, an emission layer, and an electron transport layer on the anode 132 in that order or in the reverse order.

The cathode 136 is formed on the upper surfaces and the side surfaces of the light-emitting stack 134 and the bank 138 so as to face the anode 132, with the light-emitting stack 134 interposed therebetween. In the case in which the cathode 136 is applied to a bottom-emission-type organic light-emitting display device, the cathode 136 is formed in a multi-layer structure including a transparent conductive layer and an opaque conductive layer having high reflection efficiency. The transparent conductive layer is formed of a material having a relatively high work function, such as indium-tin-oxide (ITO) or indium-zinc-oxide (IZO), and the opaque conductive layer is formed in a single-layer or multi-layer structure including a material selected from the group consisting of Al, Ag, Cu, Pb, Mo, Ti, and alloys thereof. For example, the cathode 136 is formed in a structure such that a transparent conductive layer, an opaque conductive layer, and a transparent conductive layer are sequentially stacked.

A color filter 128 is disposed on the gate insulation film 114 so as to overlap the emission region defined by the bank 138. Any one of a red (R) color filter, a green (G) color filter, and a blue (B) color filter is disposed in each subpixel. That is, a red color filter 128 is disposed in the red (R) subpixel, a green color filter 128 is disposed in the green (G) subpixel, and a blue color filter 128 is disposed in the blue (B) subpixel. Accordingly, white light generated in the light-emitting stack 134 passes through the color filter 128, whereby the color filter 128 realizes colored light corresponding thereto. The color filter 128 may extend so as to cover at least one of the switching thin-film transistor TS or the driving thin-film transistor TD, and may absorb external light. The color filter 128 may also prevent external light from being incident on the active layer 154 and 104 of the switching and driving thin-film transistors TS and TD.

As such, when the light-emitting stack 134 generates white light, the white light generated by the light-emitting stack 134 is incident on the color filter 128, thereby realizing a color image. Alternatively, each light-emitting stack 134 may realize a color image without a color filter 128 by generating colored light corresponding to a respective one of the subpixels. That is, the light-emitting stack 134 of the red (R) subpixel may generate red light, the light-emitting stack 134 of the green (G) subpixel may generate green light, and the light-emitting stack 134 of the blue (B) subpixel may generate blue light.

The planarization layer 116 is formed of a transparent organic insulation material such as acrylic resin for planarization on the substrate 101, on which the color filter 128 has been formed. The planarization layer 116 serves as a white color filter in the white subpixel, in which the color filter 128 is not formed. The planarization layer 116 is disposed at the intersection between the vertical line (e.g. the data line DL) and the horizontal line (e.g. the scan line SL) and in the emission region in which the color filter 128 is disposed. The planarization layer 116 is not formed in a driving circuit region A in which the switching and driving thin-film transistors TS and TD are disposed so as not to overlap the driving circuit region in which the switching and driving thin-film transistors TS and TD are disposed.

According to embodiments of the present disclosure, the lower pad electrode 142 and each of the source and drain electrodes 156, 106, 158 and 108 are disposed on the active layer 154, 104 and 148 so as to expose the side surface of the active layer 154, 104 and 148. That is, the lower pad electrode 142 and each of the source and drain electrodes 156, 106, 158 and 108 are directly connected to the active layer 154, 104 and 148 without a separate contact hole. Accordingly, embodiments of the present disclosure may be capable of reducing the total number of contact holes, and thus, improving an aperture ratio.

In addition, according to embodiments of the present disclosure, the data line, the lower pad electrode 142, the source electrode 156 and 106, the drain electrode 158 and 108, and the active layer 154, 104 and 148 are formed through the same mask process, and the scan line SL, the gate electrode 152 and 102, the storage electrode 126, the upper pad electrode 144, and the anode 132 are formed through the same mask process. Accordingly, the present disclosure may reduce the number of mask processes by a total of at least two times compared to the related art, thereby simplifying the structure and manufacturing process of the device and consequently achieving enhanced productivity.

FIGS. 4A to 4G are cross-sectional views illustrating a method of manufacturing the organic light-emitting display device illustrated in FIG. 3.

Figure 4A:
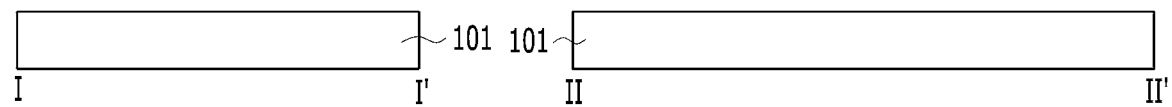
FIGS. 4A to 4G are cross-sectional views illustrating a method of manufacturing the organic light-emitting display device illustrated in FIG. 3.
Figure 4A:
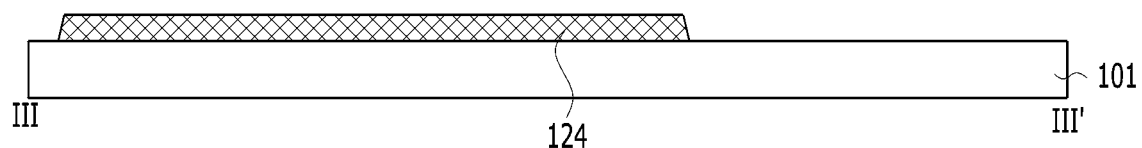

With reference to FIG. 4A, the light-shielding layer 124 is formed on the substrate 101. For example, after a first conductive layer is deposited on the entire surface of the substrate 101, the first conductive layer is patterned through a photolithography process and an etching process, thereby forming the light-shielding layer 124.

Figure 4B:
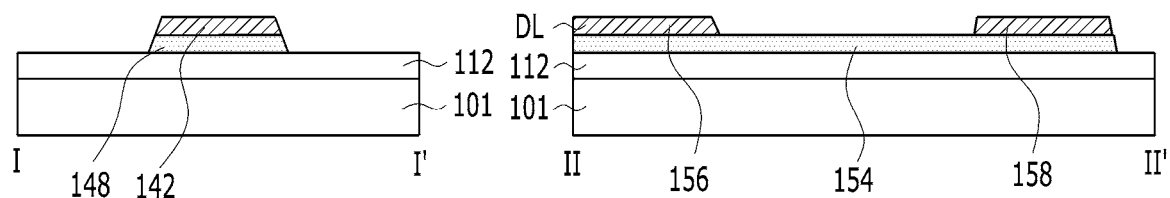
Figure 4B:
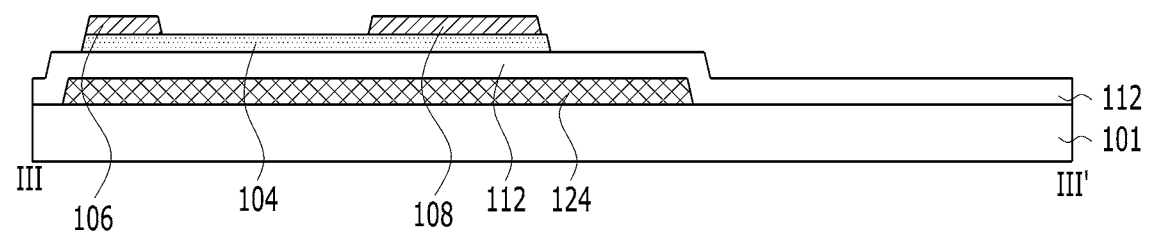

With reference to FIG. 4B, the buffer layer 112 is formed on the substrate 101, on which the light-shielding layer 124 has been formed. The active layer 148, 154 and 104, the lower pad electrode 142, the data line DL, the source electrode 156 and 106, and the drain electrode 158 and 108 are formed on the buffer layer 112 through the same mask process.

For example, the buffer layer 112 is formed by depositing an inorganic insulation material such as SiOx or SiNx on the entire surface of the substrate 101, on which the light-shielding layer 124 has been formed. Subsequently, the active layer 154 and 104 and a second conductive layer are sequentially stacked on the substrate 101, on which the buffer layer 112 has been formed. When the active layer 154 and 104 is deposited, the flow rate of at least one of oxygen or hydrogen is controlled so as to form the conductive active layer 154 and 104. For example, when the active layer 154 and 104 is deposited, the conductive active layer 154 and 104 is formed by decreasing the relative flow rate of oxygen or increasing the relative flow rate of hydrogen.

Subsequently, a photoresist pattern having a multi-stage structure is formed on the second conductive layer through a photolithography process using a halftone mask. The active layer 154 and 104 and the second conductive layer are simultaneously patterned through an etching process using the photoresist pattern having a multi-stage structure as a mask. Accordingly, the lower pad electrode 142, the data line DL, the source electrode 156 and 106, and the drain electrode 158 and 108 are formed on the active layer 154 and 104 so as to have the same shape as the active layer 154 and 104.

Subsequently, the second conductive layer, which is disposed between the source electrode 156 and 106 and the drain electrode 158 and 108, is exposed by ashing the photoresist pattern having a multi-stage structure. The exposed second conductive layer is removed through an etching process using the ashed photoresist pattern as a mask. As a result, the source and drain electrodes 156, 106, 158, and 108 are separated from each other, and the active layer 154 and 104 is exposed between the source and drain electrodes 156, 106, 158, and 108.

Figure 4C:
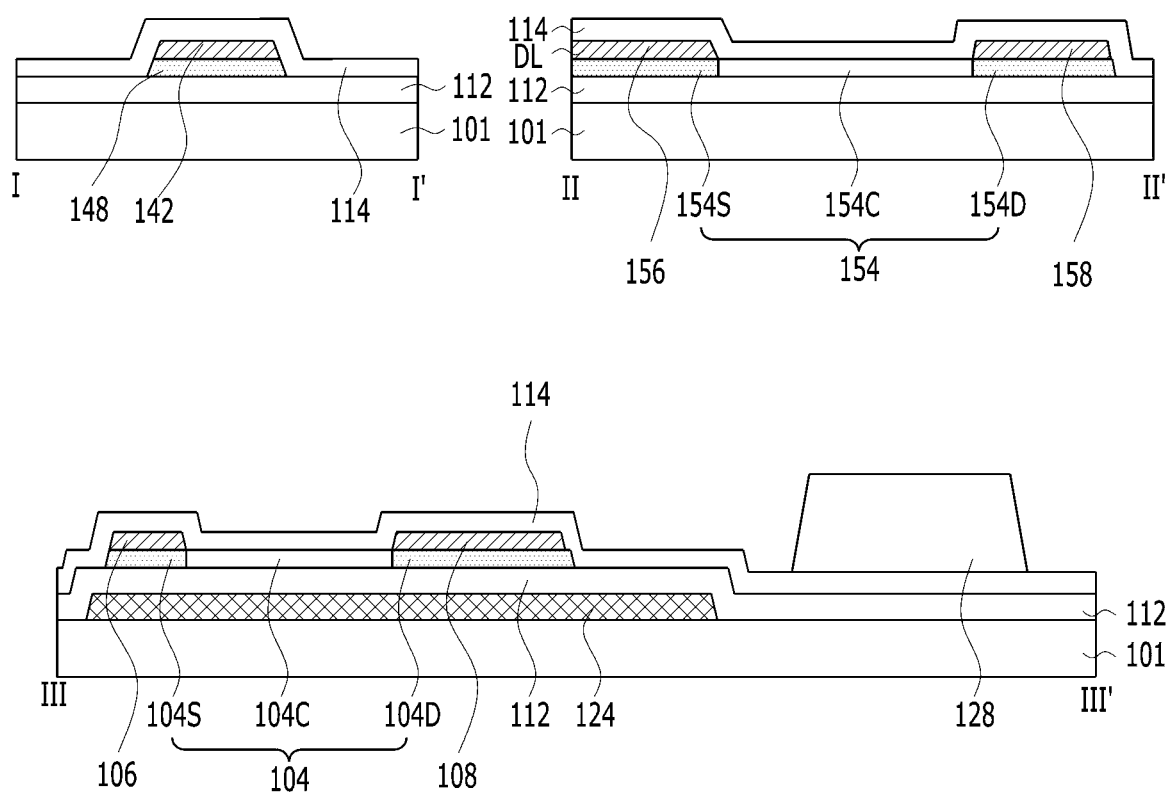

With reference to FIG. 4C, the gate insulation film 114 is formed on the substrate 101, on which the active layer 148, 154 and 104, the lower pad electrode 142, the data line DL, the source electrode 156 and 106, and the drain electrode 158 and 108 have been formed. In addition, the color filter 128 is formed on the gate insulation film 114.

For example, the gate insulation film 114 is formed by depositing an inorganic insulation material such as SiOx or SiNx on the entire surface of the substrate 101, on which the active layer 148, the lower pad electrode 142, the data line DL, the source electrode 156 and 106, and the drain electrode 158 and 108 have been formed. When the gate insulation film 114 is deposited, the flow rate of oxygen is increased more than in the process of depositing the active layer 154 and 104, or the flow rate of hydrogen is decreased more than in the process of depositing the active layer 154 and 104. Accordingly, the active layer 154 and 104, which is exposed between the source and drain electrodes 156, 106, 158 and 108, is changed from the conductor state to a semiconductor state. That is, the source region 154S and 104S that contacts the source electrode 156 and 106 is maintained in the conductor state, which was realized in the process of depositing the active layer 154 and 104, the drain region 154D and 104D that contacts the drain electrode 158 and 108 is maintained in the conductor state, which was realized in the process of depositing the active layer 154 and 104, and the portion of the active layer 154 and 104 that is exposed between the source and drain electrodes 156, 106, 158 and 108 is changed to the channel region 154C and 104C in a semiconductor state.

Subsequently, color resin is applied on the gate insulation film 114, and is then patterned through a photolithography process, thereby forming the color filter 128.

Figure 4D:
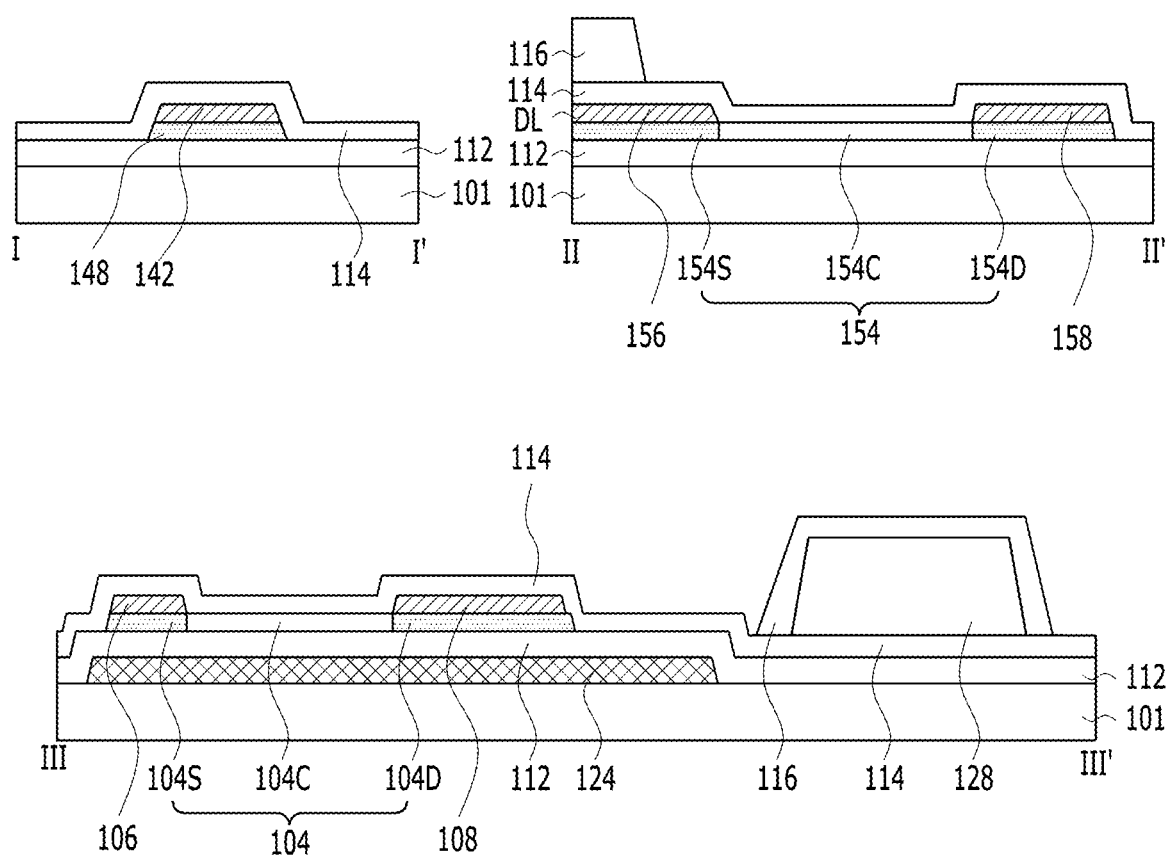

With reference to FIG. 4D, the planarization layer 116 is formed on the substrate 101, on which the color filter 128 has been formed. For example, an organic film such as photo-acrylic resin is applied on the entire surface of the substrate 101, on which the color filter 128 has been formed, and is then patterned through a photolithography process, thereby forming the planarization layer 116. The planarization layer 116 is disposed on the intersection between the vertical line DL and the horizontal line SL and in the emission region in which the color filter 128 is disposed, but is not disposed in the driving circuit region in which the switching and driving thin-film transistors TS and TD are disposed.

Figure 4E:
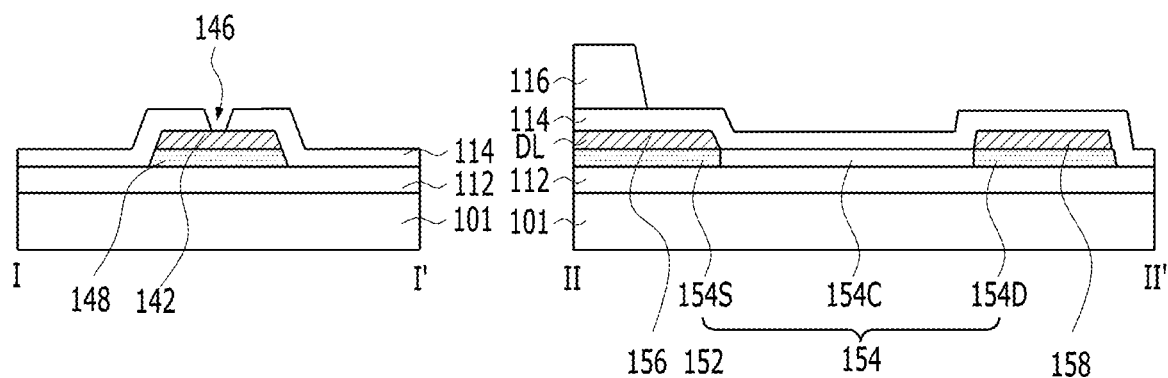
Figure 4E:
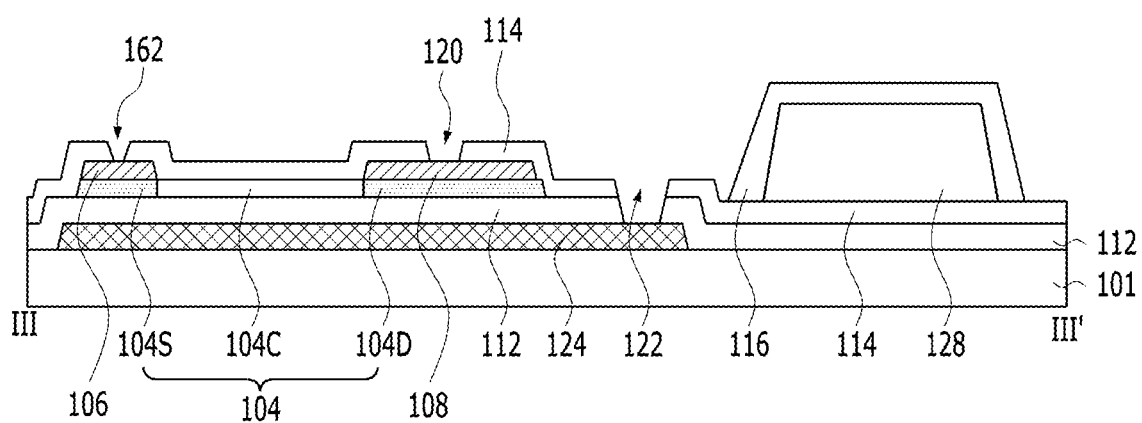

With reference to FIG. 4E, the pad contact hole 146, the source contact hole 162, the pixel contact hole 120, and the light-shielding contact hole 122 are formed on the substrate 101, on which the planarization layer 116 has been formed. For example, the gate insulation film 114, which is disposed on the substrate 101 having the planarization layer 116 formed thereon, is patterned through a photolithography process and an etching process, thereby forming the pad contact hole 146, the source contact hole 162, the pixel contact hole 120, and the light-shielding contact hole 122. Here, the pad contact hole 146, the source contact hole 162, and the pixel contact hole 120 penetrate the gate insulation film 114 and expose the lower pad electrode 142 and the source and drain electrodes 106 and 108 of the driving thin-film transistor TD, respectively. The light-shielding contact hole 122 penetrates the buffer layer 112 and the gate insulation film 114 and exposes the light-shielding layer 124.

Figure 4F:
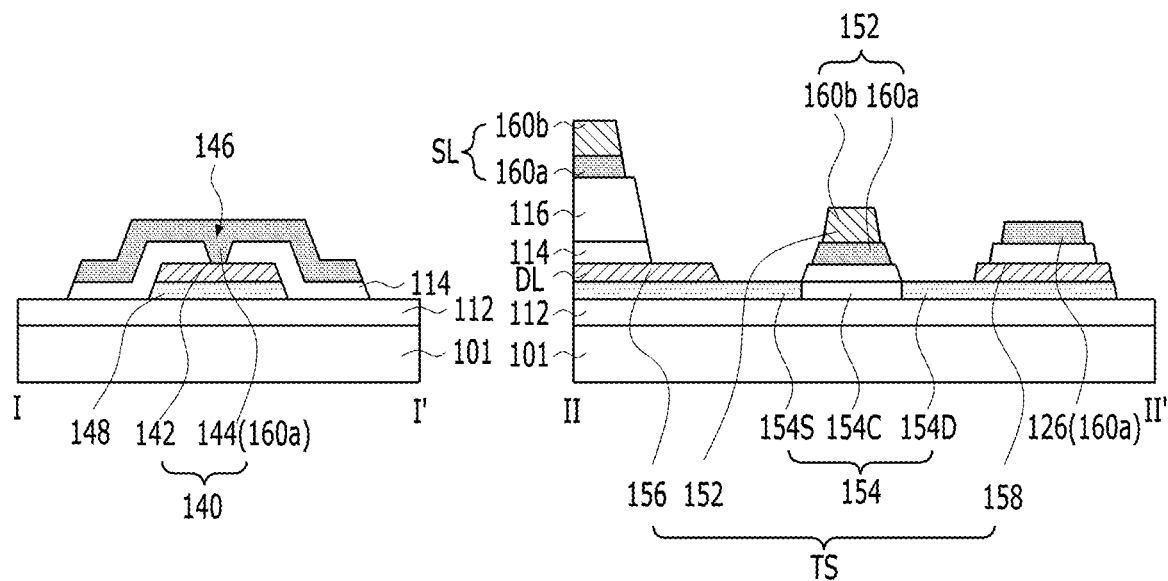
Figure 4F:
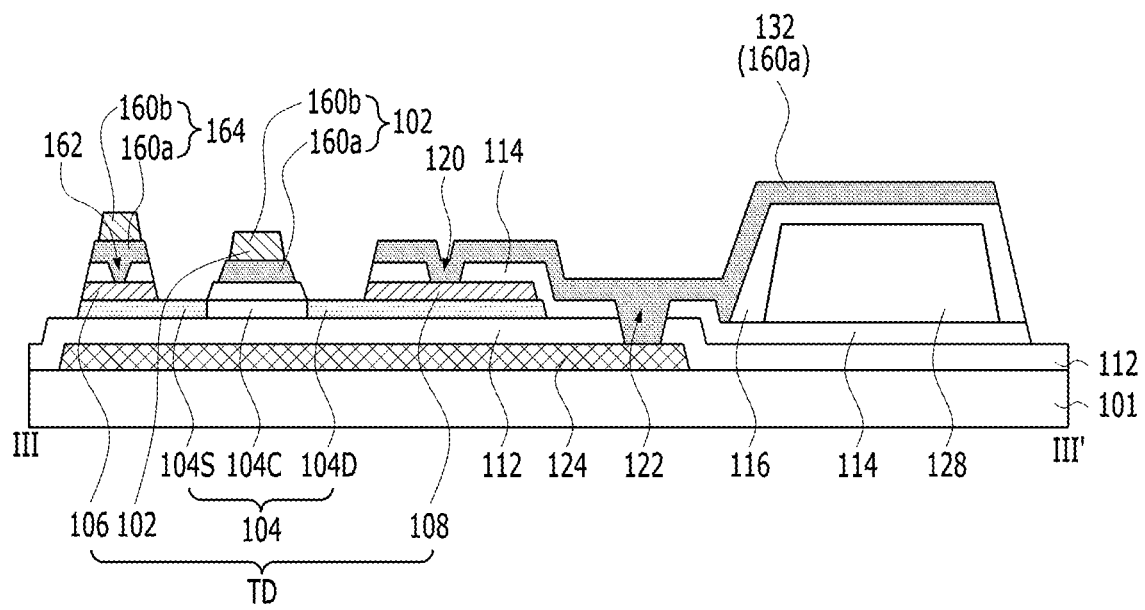

With reference to FIG. 4F, the upper pad electrode 144, the scan line SL, the gate electrode 152 and 102, the storage electrode 126, the first connection part 164, and the anode 132 are formed on the substrate 101, in which the pad contact hole 146, the source contact hole 162, the pixel contact hole 120, and the light-shielding contact hole 122 have been formed.

For example, the transparent conductive layer 160*a* and the opaque conductive layer 160*b* are sequentially formed on the substrate 101, in which the pad contact hole 146, the source contact hole 162, the pixel contact hole 120, and the light-shielding contact hole 122 have been formed. The transparent conductive layer 160*a* is formed of a transparent conductive material such as ITO. The opaque conductive layer 160*b* is formed in a single-layer or multi-layer structure including a metal material selected from the group consisting of Mo, Ti, Cu, AlNd, Al, Cr, and alloys thereof. Subsequently, a photoresist pattern having a multi-stage structure is formed through a photolithography process using a halftone mask. The transparent conductive layer 160*a*, the opaque conductive layer 160*b*, and the gate insulation film 114 are simultaneously patterned through an etching process using the photoresist pattern having a multi-stage structure as a mask. Accordingly, each of the upper pad electrode 144, the scan line SL, the gate electrode 152 and 102, the storage electrode 126, the first connection part 164, and the anode 132 is formed in a structure in which the transparent conductive layer 160*a* and the opaque conductive layer 160*b* are sequentially stacked. The gate insulation film 114 is formed in the regions overlapping the upper pad electrode 144, the scan line SL, the gate electrode 152 and 102, the storage electrode 126, the first connection part 164, and the anode 132.

Subsequently, the opaque conductive layer 160*b*, which is included in each of the upper pad electrode 144, the storage electrode 126 and the anode 132, is exposed by ashing the photoresist pattern having a multi-stage structure. The exposed opaque conductive layer 160*b* is removed through an etching process using the ashed photoresist pattern as a mask. Accordingly, each of the upper pad electrode 144, the storage electrode 126, and the anode 132 is formed as the transparent conductive layer 160*a*.

The gate insulation film 114 is also dry-etched during the process of dry-etching the opaque conductive layer 160*b* and the transparent conductive layer 160*a*, which form the upper pad electrode 144, the scan line SL, the gate electrode 152 and 102, the storage electrode 126, the first connection part 164, and the anode 132. At this time, the channel region between each of the source and drain electrodes 156, 106, 108, and 158 and the gate electrode 152 and 102 is exposed to etching gas used in the dry-etching process. As a result, a bond between metal and oxygen that form the channel region between each of the source and drain electrodes 156, 106, 108 and 158 and the gate electrode 152 and 102 is destroyed, and the oxygen is separated from the metal. In this case, vacancies are generated in the metal due to the separation of the oxygen, and free electrons are generated. Thus, the channel region between the source electrode 156 and 106 and the gate electrode 152 and 102 becomes the conductive source region 154S and 104S, the channel region between the drain electrode 108 and 158 and the gate electrode 152 and 102 becomes the conductive drain region 154D and 104D, and only the active layer disposed under the gate electrode 152 and 102 is used as the channel region 154C and 104C.

Figure 4G:
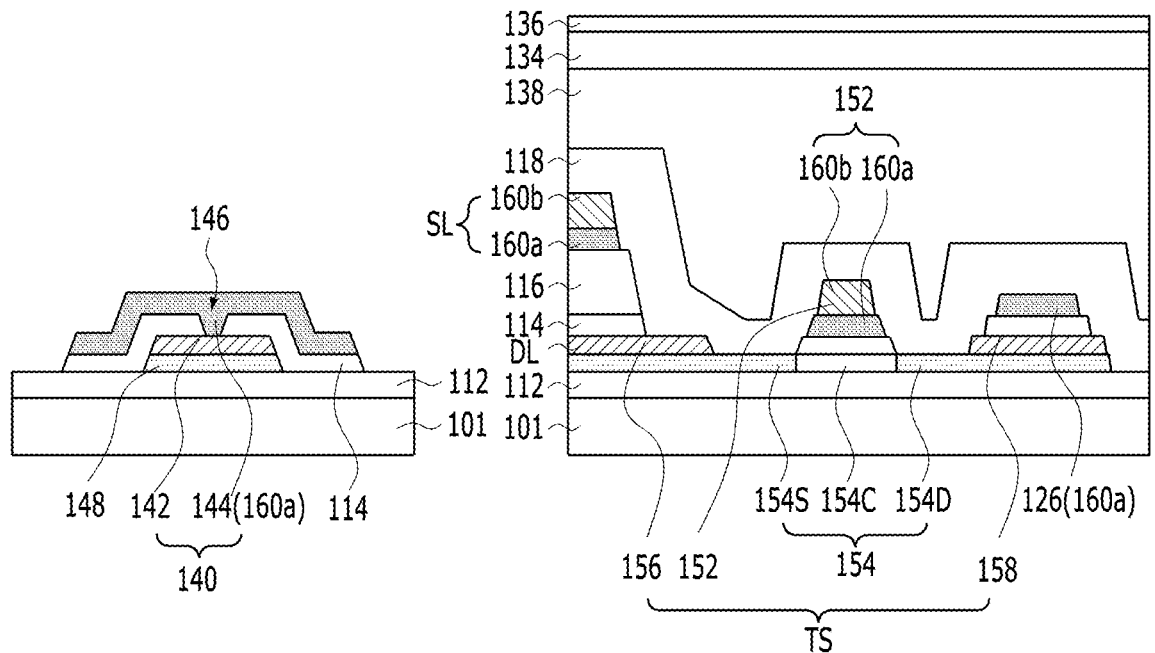
Figure 4G:
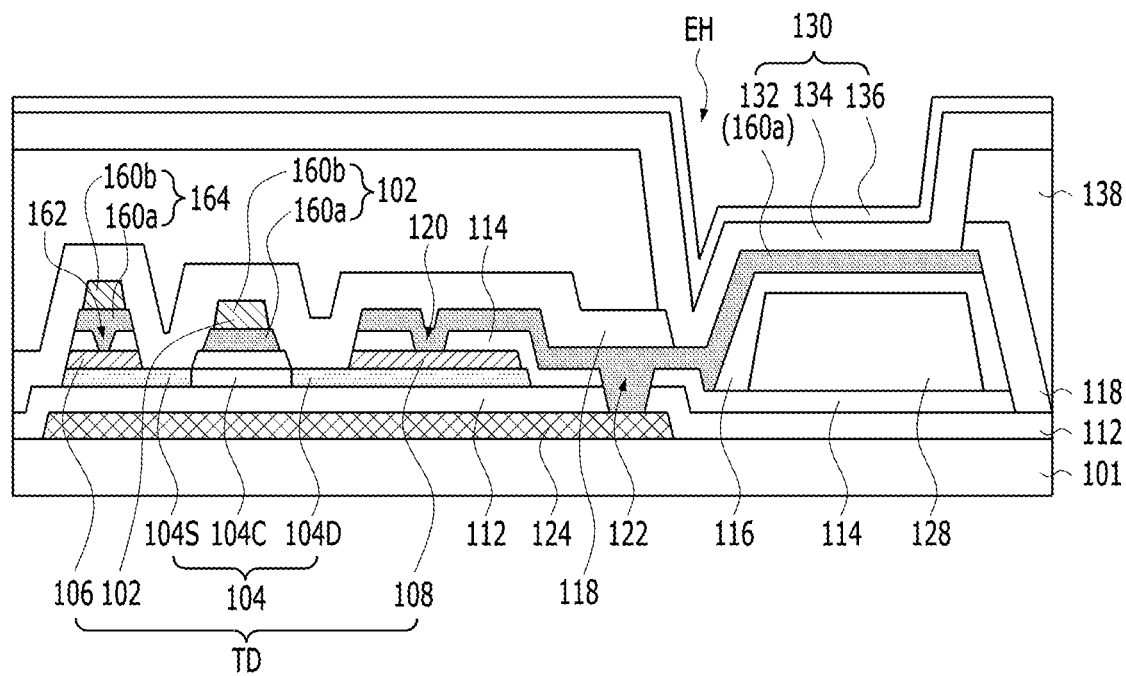

With reference to FIG. 4G, the protective film 118, the bank 138, the light-emitting stack 134, and the cathode 136 are formed on the substrate 101, on which the upper pad electrode 144, the scan line SL, the gate electrode 152 and 102, the storage electrode 126, the first connection part 164, and the anode 132 have been formed.

For example, the protective film 118 is formed on the substrate 101, on which the upper pad electrode 144, the scan line SL, the gate electrode 152 and 102, the storage electrode 126, the first connection part 164, and the anode 132 have been formed. The protective film 118 is formed of an inorganic insulation material such as SiOx or SiNx. Subsequently, an organic film such as photo-acrylic resin is applied on the entire surface of the substrate 101, on which the protective film 118 has been formed, and is then patterned through a photolithography process, thereby forming the bank 138. Subsequently, the protective film 118 is patterned through an etching process using the bank 138 as a mask, with the result that the protective film 118 is formed under the bank 138 and has the same shape as the bank 138. Subsequently, the light-emitting stack 134 and the cathode 136 are sequentially formed in the active area AA, rather than the pad area PA, through a deposition process using a shadow mask.

Figure 5:
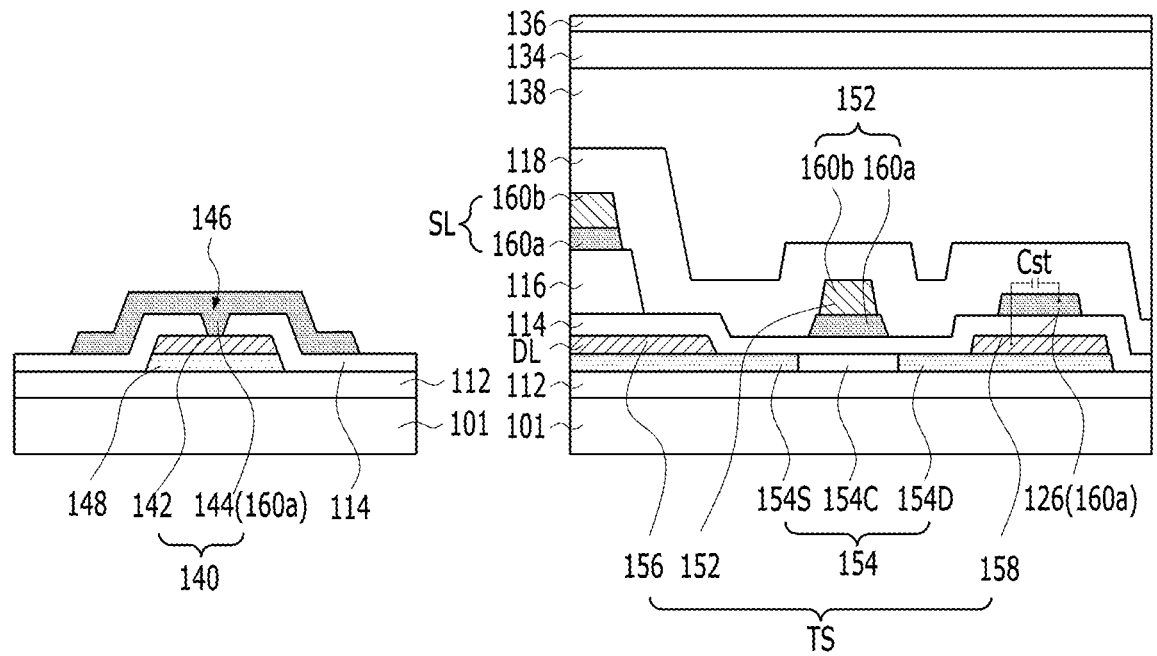
FIG. 5 is a cross-sectional view illustrating another example of the gate insulation film illustrated in FIG. 3.
Figure 5:
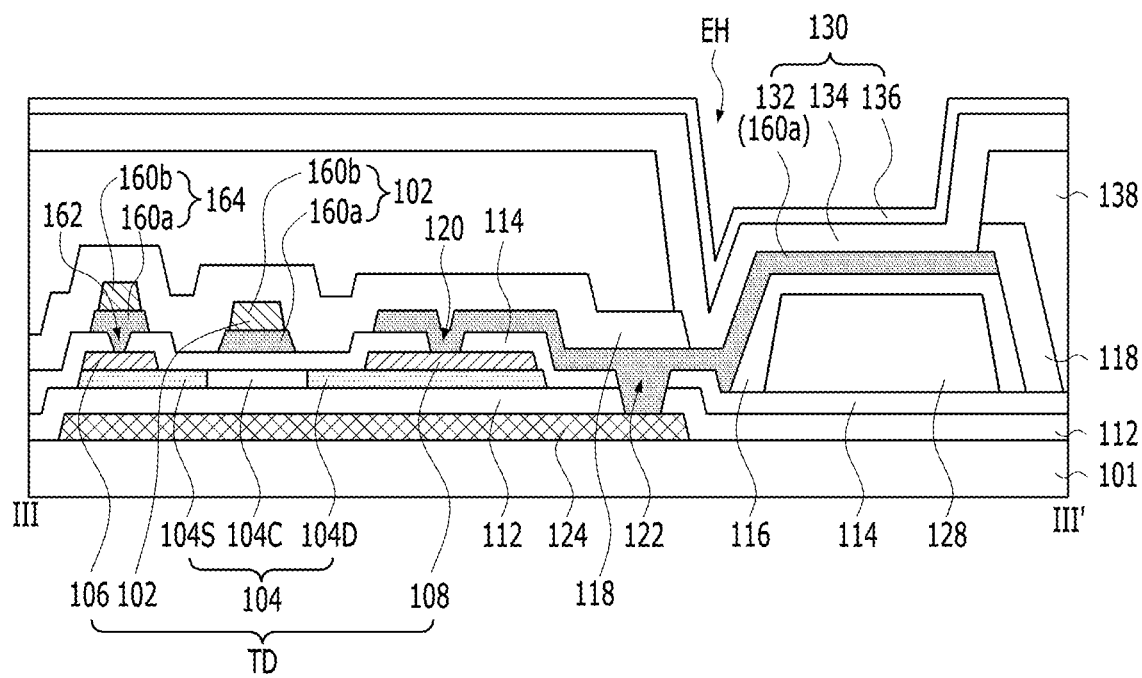

In embodiments of the present disclosure, a configuration in which the gate insulation film 114 is removed between each of the source and drain electrodes 156, 106, 158, and 108 and the gate electrode 152 and 102 has been described by way of example. Alternatively, as illustrated in FIG. 5, the gate insulation film 114 may be disposed between each of the source and drain electrodes 156, 106, 158, and 108 and the gate electrode 152 and 102. In this case, the source region 154S and 104S and the drain region 154D and 104D of the active layer 154 and 104 illustrated in FIG. 5 may be made conductive using an ultraviolet ray (UV). That is, after the upper pad electrode 144, the scan line SL, the gate electrode 152 and 102, the storage electrode 126, the first connection part 164, and the anode 132 are formed, an ultraviolet ray is radiated to the active layer 154 and 104, which is formed of an oxide semiconductor material. As an ultraviolet ray is radiated to a portion of the active layer 154 and 104 that is exposed between each of the source and drain electrodes 156, 106, 158 and 108 and the gate electrode 152 and 102, a bond between metal and oxygen forming the active layer 154 and 104 is destroyed, and the oxygen is separated from the metal. In this case, vacancies are generated in the metal due to the separation of the oxygen, and free electrons are generated. As a result, the source region 154S and 104S and the drain region 154D and 104D, in which free electrons are generated, are formed at both sides of the channel region 154C and 104C.

Figure 6:
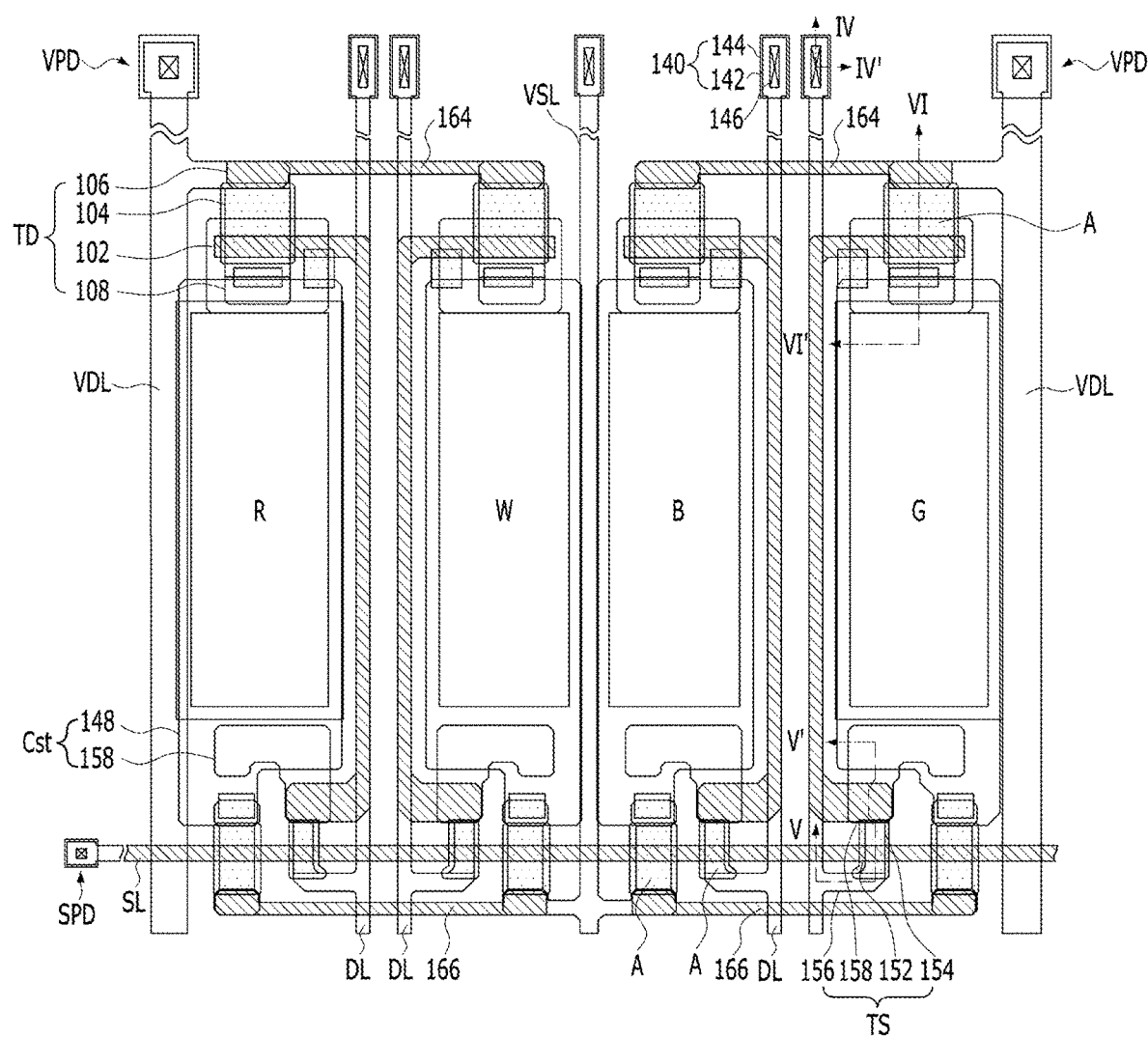
FIG. 6 is a plan view illustrating a unit pixel of an organic light-emitting display device according to a second embodiment of the present disclosure.
Figure 7:
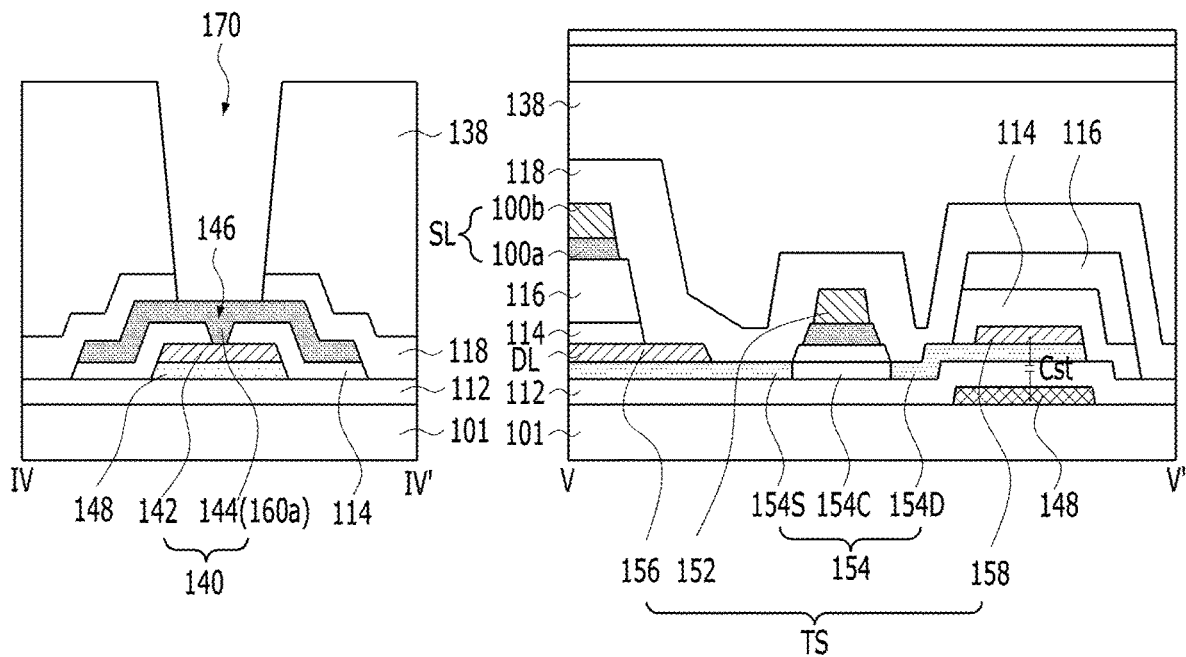
FIG. 7 illustrates cross-sectional views taken along lines IV-IV', V-V' and VI-VI' in the organic light-emitting display device illustrated in FIG. 6.
Figure 7:
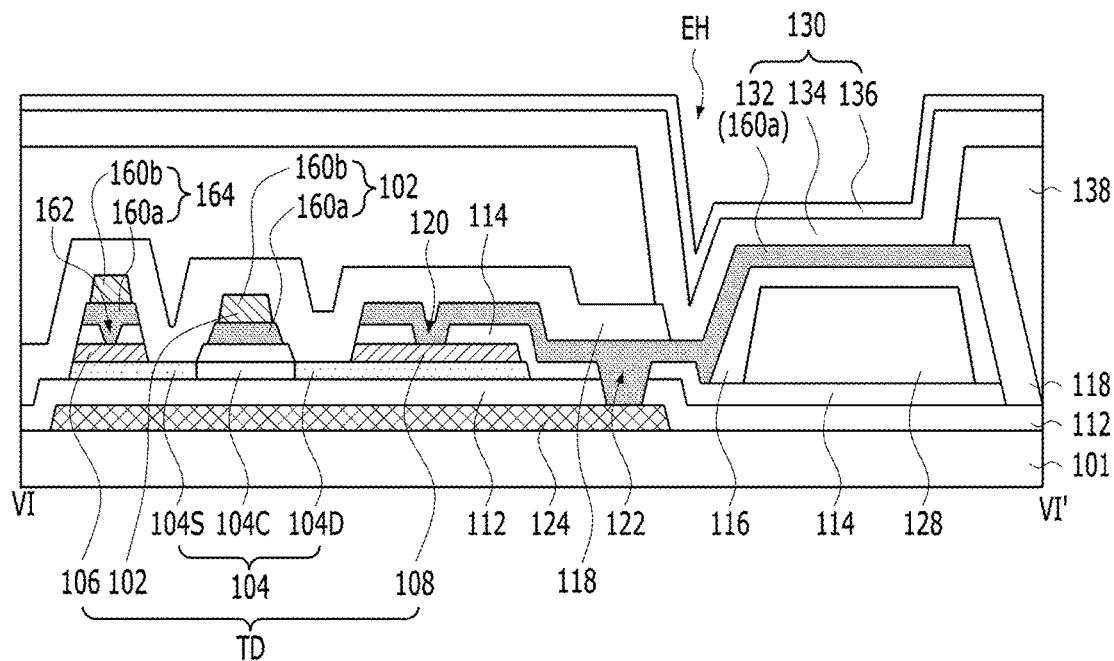

FIG. 6 is a plan view illustrating an organic light-emitting display device according to a second embodiment of the present disclosure. FIG. 7 illustrates cross-sectional views taken along lines IV-IV', V-V' and VI-VI' in the organic light-emitting display device illustrated in FIG. 6.

The organic light-emitting display device according to the second embodiment of the present disclosure illustrated in FIGS. 6 and 7 has the same constituent components as the organic light-emitting display device illustrated in FIGS. 2 and 3, except that the planarization layer 116 is disposed on the storage capacitor Cst. A detailed explanation of the same constituent components will be omitted.

The drain electrode 158 of the switching thin-film transistor TS overlaps the storage electrode 148, with the buffer layer 112 interposed therebetween, with the result that the storage capacitor Cst is formed. The storage electrode 148 is disposed on the substrate 101 and is formed of the same material as the light-shielding layer 124. The storage electrode 148 is connected to the drain electrode 108 of the driving thin-film transistor TD.

The gate insulation film 114, the planarization layer 116, the protective film 118, and the bank 138 are sequentially disposed on the storage capacitor Cst. Here, because the gate insulation film 114 and the planarization layer 116 are formed through the same mask process, the gate insulation film 114 and the planarization layer 116 have the same shape and the same line width as each other. The planarization layer 116 is disposed at the intersection between the vertical line (e.g. the data line DL) and the horizontal line (e.g. the scan line SL), in the region in which the storage capacitor is disposed, and in the emission region in which the color filter 128 is disposed. The planarization layer 116 is not disposed in the driving circuit region A that corresponds to the active layers 154 and 104 of the switching and driving thin-film transistors TS and TD, so as not to overlap the active layers 154 and 104 of the switching and driving thin-film transistors TS and TD.

Figure 8A:
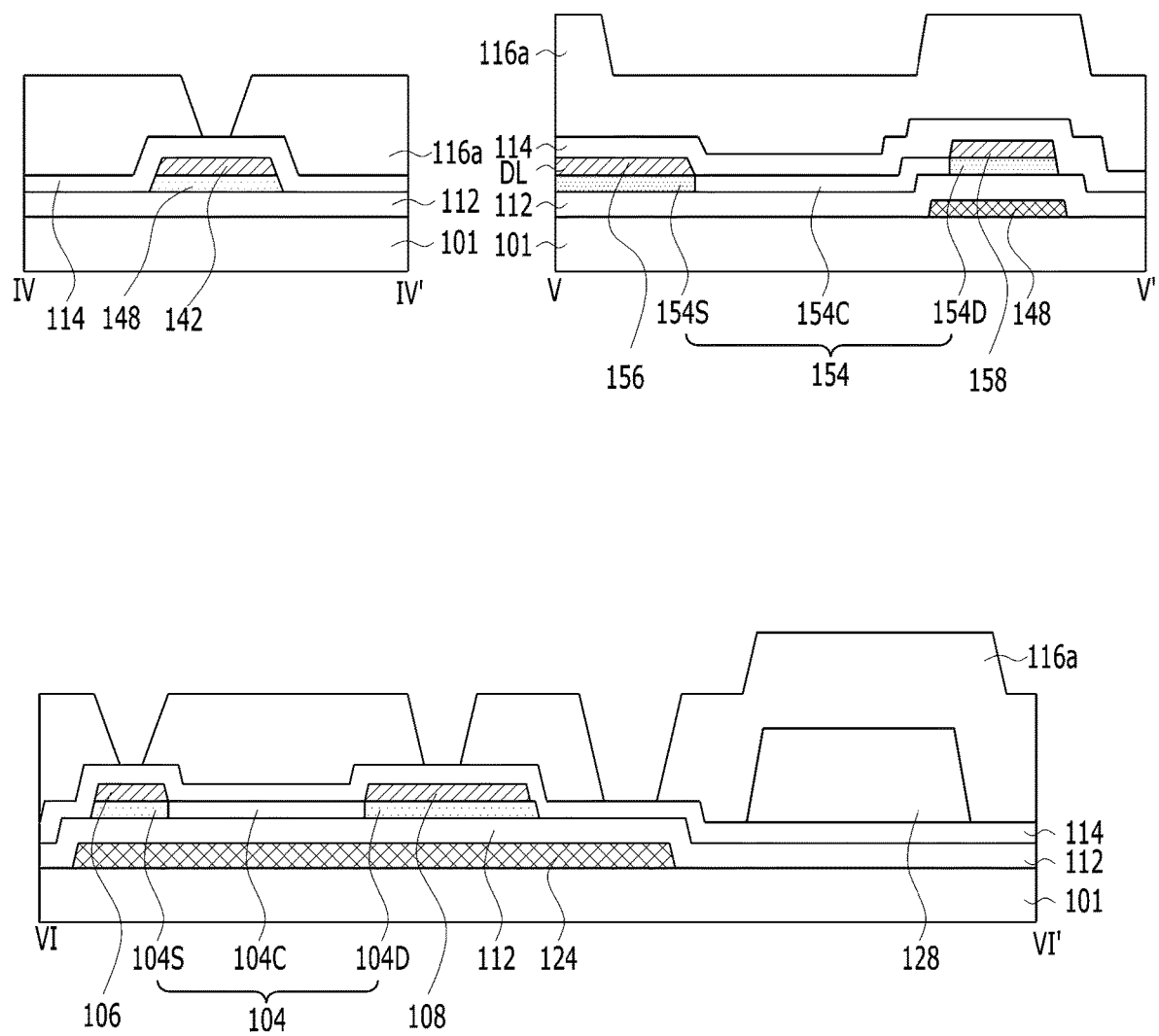
FIGS. 8A to 8C are cross-sectional views illustrating a method of manufacturing the gate insulation film and the planarization layer illustrated in FIG. 7.
Figure 8B:
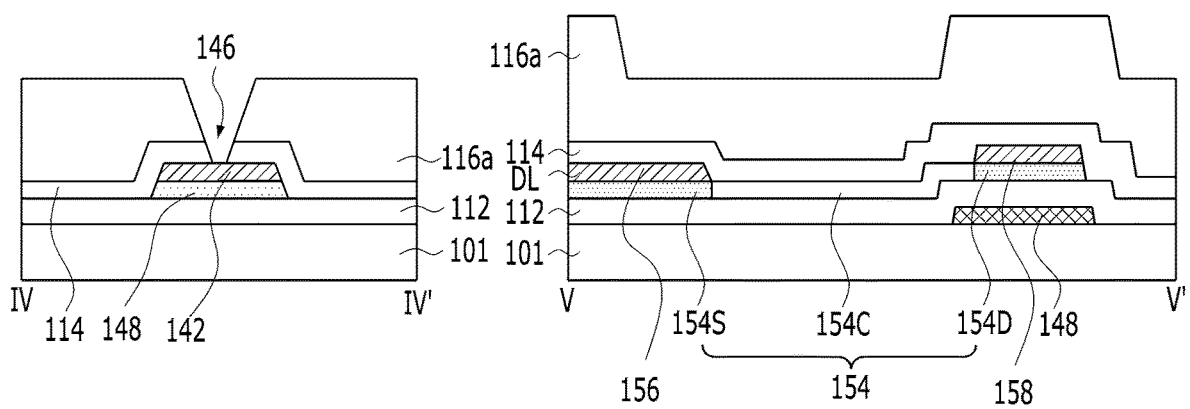
Figure 8B:
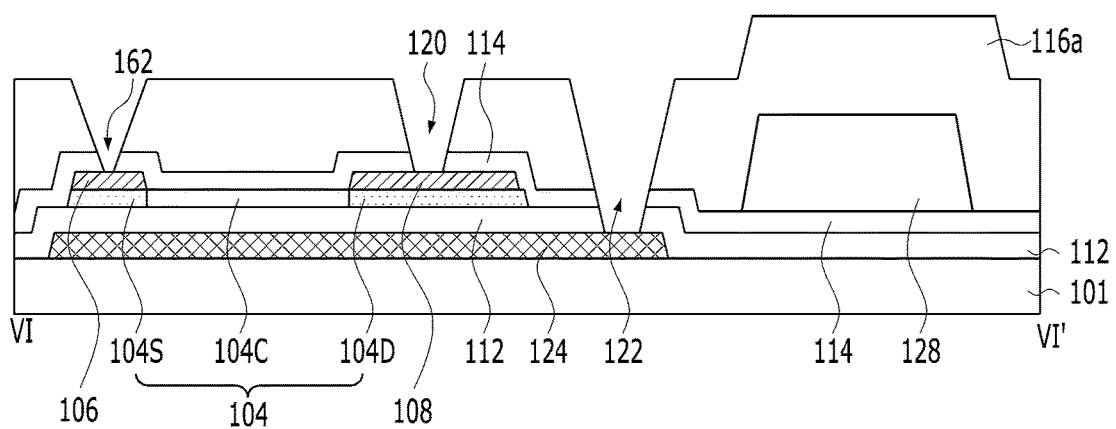
Figure 8C:
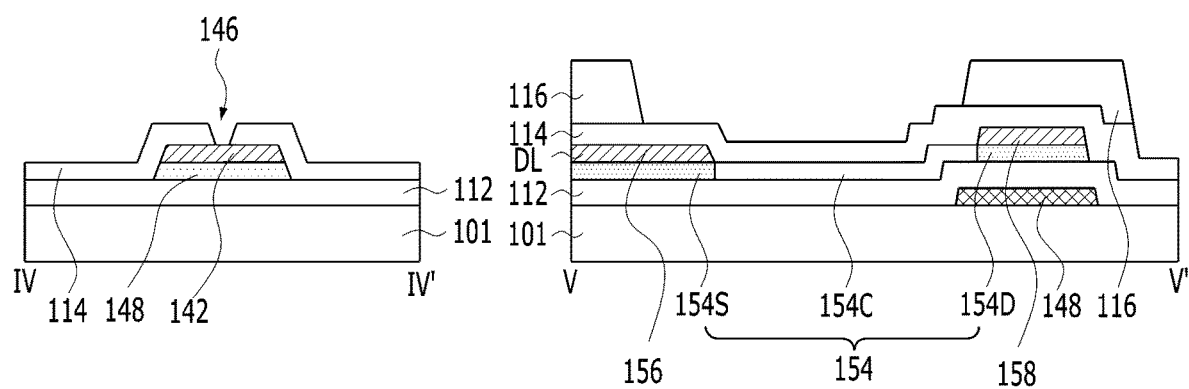
Figure 8C:
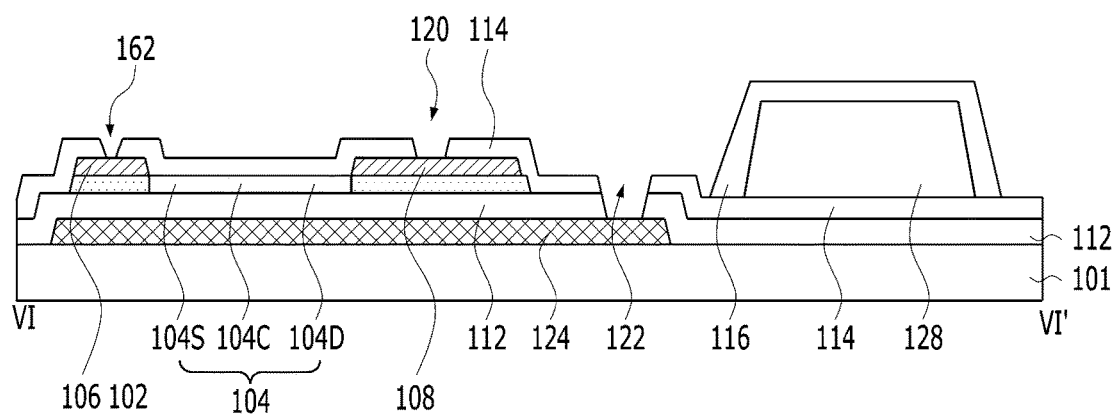

FIGS. 8A to 8C are cross-sectional views illustrating in detail a process of manufacturing the gate insulation film and the planarization layer illustrated in FIG. 7.

An organic film for planarization is applied on the substrate 101 having the color filter 128 formed by the manufacturing method illustrated in FIG. 4C thereon. Subsequently, the organic film is patterned through a photolithography process using a halftone mask, with the result that the organic film 116a having a multi-stage structure is formed, as illustrated in FIG. 8A. The gate insulation film 114 and the buffer layer 112 are patterned through an etching process using the organic film 116a having a multi-stage structure as a mask, with the result that the pad contact hole 146, the source contact hole 162, the pixel contact hole 120, and the light-shielding contact hole 122 are formed, as illustrated in FIG. 8B.

Subsequently, the organic film 116a having a multi-stage structure is ashed and becomes the planarization layer 116, which is disposed at the intersection between the scan line SL and the data line DL, on the storage electrode 148, and on the color filter 128, as illustrated in FIG. 8C.

As described above, in the organic light-emitting display device according to the second embodiment of the present disclosure, the planarization layer 116 and the gate insulation film 114 are formed through the same mask process. Accordingly, the second embodiment of the present disclosure may reduce the number of mask processes by a total of at least three times compared to the related art, thereby simplifying the structure and manufacturing process of the device and consequently achieving enhanced productivity.

In embodiments of the present disclosure, the protective film 118 and the planarization layer 138 may not be disposed in the pad region in which the conductive pad 140 is disposed, as illustrated in FIG. 3, or may be disposed so as to have therein a second pad contact hole 170 for exposing the upper pad electrode 144, as illustrated in FIG. 7. As illustrated in FIG. 7, a stepped portion may be formed due to the protective film 118 and the planarization layer 138, which are disposed so as to cover both sides of the upper pad electrode 144. Because the stepped portion may cause TAB process defects, the structure of the conductive pad 140 illustrated in FIG. 3 may be more suitable than that illustrated in FIG. 7.

Although the present disclosure has been described with reference to the organic light-emitting display device, the present disclosure may also be applied to a display device having a thin-film transistor.

As is apparent from the above description, according to an organic light-emitting display device of embodiments of the present disclosure, source and drain electrodes and an active layer may be formed through the same single mask process, and thus each of the source and drain electrodes and the active layer are directly connected to each other without a separate contact hole. Accordingly, it may be possible to reduce the total number of contact holes and thus improve an aperture ratio by at least 28% compared to a structure in which each of source and drain electrodes and an active layer are connected to each other through a contact hole.

In addition, source and drain electrodes and an active layer may be formed through the same single mask process, and a gate electrode and an anode may be formed through the same single mask process. Accordingly, it may be possible to reduce the number of mask processes by a total of at least two times compared to the related art, thereby simplifying the structure and manufacturing process of the device and consequently achieving enhanced productivity.

In addition, because a planarization layer and a gate insulation film may be formed through the same single mask process, it may be possible to further reduce the number of mask processes.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. An organic light-emitting display device, comprising:
a substrate;
a driving thin-film transistor including:
an active layer on the substrate;
source and drain electrodes directly contacting the active layer;
a gate insulation film on the source and drain electrodes and on the active layer; and
a gate electrode on the gate insulation film; and
an organic light-emitting element connected to the driving thin-film transistor and including an anode,
wherein the gate electrode of the driving thin-film transistor includes a first portion of a transparent conductive layer, and the anode of the organic light-emitting element includes a second portion of the same transparent conductive layer, the first portion being spaced apart from the second portion, wherein the second portion of the transparent conductive layer directly contacts the drain electrode of the driving thin-film transistor via a contact hole through the gate insulation film.

2. The organic light-emitting display device according to claim 1, further comprising:
a switching thin-film transistor connected to the driving thin-film transistor, the switching thin-film transistor including:
an active layer;
a gate electrode including a third portion of the transparent conductive layer,
the third portion being spaced apart from the first and second portions; and
source and drain electrodes,
wherein each of the source and drain electrodes of the switching thin-film transistor exposes a respective side surface of the active layer of the switching thin-film transistor.

3. The organic light-emitting display device according to claim 2, wherein an entire lower surface of each of the source and drain electrodes of at least one of the driving thin-film transistor and the switching thin-film transistor is in direct contact with the active layer of at least one of the driving thin-film transistor and the switching thin-film transistor.

4. The organic light-emitting display device according to claim 2, further comprising:
a scan line and a data line, each connected to the switching thin-film transistor; and
a planarization layer between the scan line and the data line,
wherein the scan line includes a fourth portion of the transparent conductive layer.

5. The organic light-emitting display device according to claim 4, further comprising:
a lower pad electrode connected to at least one of the scan line and the data line; and
an upper pad electrode connected to the lower pad electrode, the upper pad electrode including a fifth portion of the transparent conductive layer.

6. The organic light-emitting display device according to claim 5, wherein:
the gate insulation film has therein a pad contact hole exposing the lower pad electrode, and
the upper pad electrode has a same line width as the gate insulation film.

7. The organic light-emitting display device according to claim 2, wherein:
the gate electrode of the driving thin-film transistor further includes a first portion of an opaque conductive layer on the first portion of the transparent conductive layer; and
the gate electrode of the switching thin-film transistor further includes a second portion of the opaque conductive layer on the third portion of the transparent conductive layer.

8. The organic light-emitting display device according to claim 7, further comprising:
the gate insulation film between the gate electrode of each of the switching thin-film transistor and the driving thin-film transistor and the active layer of each of the switching thin-film transistor and the driving thin-film transistor; and a storage electrode overlapping the drain electrode of the switching thin-film transistor, with the gate insulation film interposed therebetween.

9. The organic light-emitting display device according to claim 8, wherein the storage electrode is formed from a sixth portion of the same transparent conductive layer.

10. The organic light-emitting display device according to claim 8, further comprising a protective film and a bank sequentially disposed on the storage electrode.

11. The organic light-emitting display device according to claim 2, further comprising:
a light-shielding layer overlapping the driving thin-film transistor;
a buffer layer between the light-shielding layer and the driving thin-film transistor; and
a storage electrode overlapping the drain electrode of the switching thin-film transistor, with the buffer layer interposed therebetween.

12. The organic light-emitting display device according to claim 11, wherein the storage electrode is formed of a same material as the light-shielding layer, and is in a same plane as the light-shielding layer.

13. The organic light-emitting display device according to claim 12, further comprising a planarization layer, a protective film, and a bank sequentially disposed on the drain electrode of the switching thin-film transistor.

14. The organic light-emitting display device according to claim 13, wherein the planarization layer has a same shape as the gate insulation film.

15. The organic light-emitting display device according to claim 1, wherein the portions of the active layer that are directly contacted by the source and drain electrodes are conductive, with a channel region therebetween.

16. The organic light-emitting display device of claim 1, further comprising:
a light shielding layer between the substrate and the active layer of the driving thin-film transistor,
wherein the second portion of the transparent conductive layer directly contacts the light shielding layer.

17. An organic light-emitting display device, comprising:
a substrate;
a driving thin-film transistor including:
an active layer on the substrate;
source and drain electrodes directly contacting the active layer;
a gate insulation film on the source and drain electrodes and on the active layer; and
a gate electrode on the gate insulation film; and
an organic light-emitting element connected to the driving thin-film transistor and including an anode,
wherein the gate electrode of the driving thin-film transistor includes a first portion of a transparent conductive layer, and the anode of the organic light-emitting element is formed of a second portion of the same transparent conductive layer, the first portion being spaced apart from the second portion,
wherein the second portion of the transparent conductive layer directly contacts the drain electrode of the driving thin-film transistor via a contact hole through the gate insulation film, and
wherein an entire lower surface of each of the source and drain electrodes overlaps the active layer.

* * * * *